United States Patent
Arora et al.

(10) Patent No.: US 8,490,038 B1
(45) Date of Patent: Jul. 16, 2013

(54) SYSTEM AND METHOD FOR AUTOMATIC PLACEMENT OF CONTACT CUTS AND SIMILAR STRUCTURES IN INTEGRATED CIRCUIT LAYOUTS

(75) Inventors: Rajan Arora, Uttar Pradesh (IN); Arnold Jean-Marie Gustave Ginetti, Antibes (FR); Gautam Kumar, New Delhi (IN)

(73) Assignee: Cadence Dsign Systems, Inc., San Jose, CA (US)

( * ) Notice: Subject to any disclaimer, the term of this patent is extended or adjusted under 35 U.S.C. 154(b) by 0 days.

(21) Appl. No.: 13/595,942

(22) Filed: Aug. 27, 2012

(51) Int. Cl.
*G06F 17/50* (2006.01)

(52) U.S. Cl.
USPC .......................................................... 716/110

(58) Field of Classification Search
USPC .......................................................... 716/110
See application file for complete search history.

(56) References Cited

U.S. PATENT DOCUMENTS

| 2010/0181681 A1* | 7/2010 | Akiba et al. | 257/773 |
| 2010/0315476 A1* | 12/2010 | Sheats | 347/204 |

* cited by examiner

*Primary Examiner* — Suchin Parihar
(74) *Attorney, Agent, or Firm* — Kenyon & Kenyon LLP

(57) ABSTRACT

A system, method, and computer program product for automatically placing contact cuts in integrated circuit layouts, particularly in guard rings, inter-layer via connections, and various space-filling structures typically defined by polygons or paths. Areas to be filled with contact cuts are partitioned horizontally and vertically, and decomposed into shared and exclusive type regions that are sorted directionally. Contact cuts are placed in each region according to its type and according to relevant design rules on contact cut spacing and enclosure constraints. Contact cuts that may cause design rule violations are deleted. Narrow jogs or cuts, merged shared regions, and non-orthogonal edges or segments in the decomposed regions are handled by alternate embodiments. The result is automated contact cut placement, even for merged/chopped layout features, that is generally more symmetric, collinear, and adds an optimal number of contact cuts in most cases than with existing tools.

25 Claims, 16 Drawing Sheets

SYSTEM AND METHOD FOR AUTOMATIC PLACEMENT OF CONTACT CUTS AND SIMILAR STRUCTURES IN INTEGRATED CIRCUIT LAYOUTS

BACKGROUND

The present invention relates to integrated circuit layouts, and in particular to automatic placement of space-filling interconnect structures in those layouts.

In integrated circuit designs, special structures called "contact cuts" may for example establish the electrical connection between at least two layers. These are holes cut vertically through various layers; a connective metal will then be placed into the holes during integrated circuit fabrication to complete the interconnection. The contact cut distribution is laid out depending upon the relevant layers' common cross-sectional overlaps (which are typically rectangular or polygonal). Layout designers must pay particular attention and put additional effort into ensuring the proper number and distribution of contact cuts to meet multiple electrical, design for manufacturability, and yield requirements.

For example, contact cuts must be organized such that the resulting current flow is distributed as evenly as possible, while also considering Ohmic losses and electromigration-related effects. The common cross-sectional overlap areas are therefore generally to be filled with contact cuts to the extent possible, considering applicable design rules governing lithographic requirements. Design rules typically specify limits on designed feature sizes, spacing requirements between features, and the extent to which a feature must be surrounded by a particular layer of material. FIG. 1 depicts a few exemplary layout features and their related design rules.

Further, as device dimensions continue to shrink, there is an increasing emphasis on regular structures with collinear edges. For example, an advantage of having regular structures with symmetric and collinear or aligned contact cuts close to each other is that various parasitic effects (such as fringe or sidewall capacitance, etc.) are uniformly distributed or matched. This is a critical requirement for some analog circuits, which may be configured into a common centroid arrangement for example. Symmetric and aligned placement of contact cuts across parallel edges or segments of a guard ring also helps in ensuring matching parasitics.

Filling up a given cross-section with perfectly aligned, symmetric, and well distributed contact cuts not only supports regular structure use (thus improving yield), but also allows a maximum number of contact cuts (thus addressing Ohmic and electromigration concerns). Further, for designs having a guard ring on a block boundary, such design practices help simplify manipulation of block instances when sharing the edges, stacking, or tiling. These issues are reflected in numerous new design rules in current design flows.

Existing automated design tool solutions for contact cut distribution have shortcomings leading to less than optimal results. Referring now to FIG. 2, an exemplary polygonal area 200 to be filled with contact cuts 202 is shown. A variety of problems with existing solutions are depicted in several subsequent figures. For example, FIG. 3 depicts a fairly good contact cut distribution within polygon 300 that nonetheless includes uneven spacings 302 between contact cuts leading to asymmetries, and gaps 304 between contact cuts and polygon boundaries, which result in non-collinear contact cuts such as those marked 306 and 308 for example. FIG. 4 depicts another contact cut distribution within polygon 400 with relatively uniform spacing but with more severe problems. In this case, major portions of contact cut rows and/or columns may be omitted in some circumstances, leading to asymmetric areas that are relatively empty of contact cuts 402.

Further, as shown in FIG. 5, contact cuts 502 may be misaligned and irregular in the presence of bends and corners in object 500 for example. Such contact cut distributions may occur across multiple edges or segments of rectangular or non-rectangular areas in guard rings or other structures in integrated circuit layouts.

Additionally, as shown in FIGS. 6A and 6B, when separate contacting target layout areas are merged, a less than maximum number of contact cuts may result. FIG. 6A depicts two polygonal areas (600 and 602) with relatively good contact cut distributions prior to a merge operation. FIG. 6B depicts the merged polygonal area after the merge operation performed by known products, which has resulted in roughly half of the contact cuts 700 being lost.

In another similar case of merging two fluid guard ring instances, FIG. 7A depicts the merged polygonal area created by a known design tool, resulting in an inconsistent and irregular distribution of contact cuts, with different contact cut rows in different segments of the same width. FIG. 7B depicts a more ideal merger result as created by an embodiment of the present invention, to be described. In a further example, FIG. 7C depicts two other polygonal areas to be merged. The output of an embodiment of the present invention, to be described, is shown in FIG. 7D with evident symmetrical placement of contact cuts across parallel segments.

Layout designers must therefore devise different schemes to fill a target layout area with a maximum possible number of perfectly aligned and symmetric contact cuts in spite of these shortcomings. This involves significant manual editing and thus loss of design productivity. An improved tool for automated contact cut placement in integrated circuit layouts is therefore needed.

BRIEF SUMMARY OF THE INVENTION

A computer-implemented method embodiment of the invention for placing contact cuts, metal slots, or similar regular structures may comprise decomposing a target layout area into shared regions and exclusive regions, and directionally sorting the decomposed regions. The embodiment further comprises, for each decomposed region, filling the decomposed region with contact cuts according to specific rules for shared and exclusive regions, and deleting contact cuts that may cause design rule violations. The target layout area may include a polygon, a path, a path segment, and/or a wire. The target layout area may be a metal slot or an intersection between at least two layers to be electrically interconnected.

Decomposing the target layout area may comprise scanning the target layout area horizontally and vertically to identify partitioned shapes, and identifying shared regions and exclusive regions as intersecting and non-intersecting partitioned shapes, respectively. The sorting may be done in top-to-bottom right-to-left order.

Contact cuts may generally be placed at a minimum enclosure dimension distance ENCL from decomposed region boundaries. For regions having a coincident edge with a neighboring orthogonally close region, however, the contact cuts may be placed at a distance from the coincident edge equal to the minimum contact cut spacing CS minus the minimum enclosure distance ENCL, with the quantity (CS-ENCL) limited to zero if negative.

The contact cuts that may cause design rule violations may be detected by growing the region in which they are placed, and detecting any overlap of another contact cut in a neighboring region.

Another embodiment may further comprise a method of merging all the adjoining shared regions, to maximize the number of contact cuts. An alternative embodiment may instead further comprise a method of merging narrow partitioned shapes with adjoining partitioned shapes of the same horizontal or vertical orientation, prior to identifying shared and exclusive regions.

Yet another embodiment may instead further comprise a method of identifying rotated portions in the target layout area, taking unions of all the rotated portions, and filling all the rotated portions. The filling may comprise, for example, for each rotated portion, finding a bounding box of the rotated portion shape, filling the bounding box with contact cuts, and deleting the contact cuts that are not inside the rotated portion.

Another embodiment comprises merging all the adjoining shared regions before filling them, merging the narrow shared regions, and filling shared regions using the same rule as for exclusive regions. Other embodiments may also include a related manufacturing method, an article of manufacture such as an integrated circuit produced via such a manufacturing method, and a computer program product having machine-readable executable program instructions thereon to direct a processor to perform the method, for example.

As described more fully below, the embodiments disclosed permit automatic placement of contact cuts and similar structures in integrated circuit layouts. Further aspects, objects, desirable features, and advantages of the systems and methods disclosed herein will be better understood and apparent to one skilled in the relevant art in view of the detailed description and drawings that follow, in which various embodiments are illustrated by way of example. It is to be expressly understood, however, that the drawings are for the purpose of illustration only and are not intended as a definition of the limits of the claimed invention.

DETAILED DESCRIPTION

Figure 1:
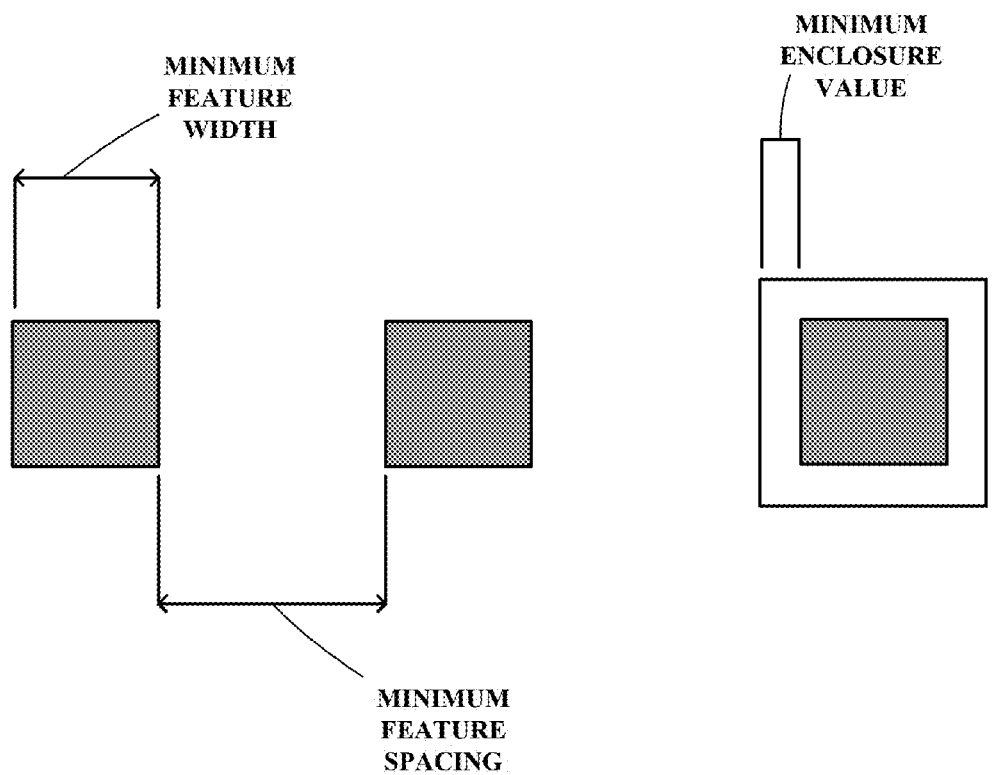
FIG. 1 is a diagram of exemplary design rules regarding feature size, feature spacing, and feature enclosure constraints.
Figure 2:
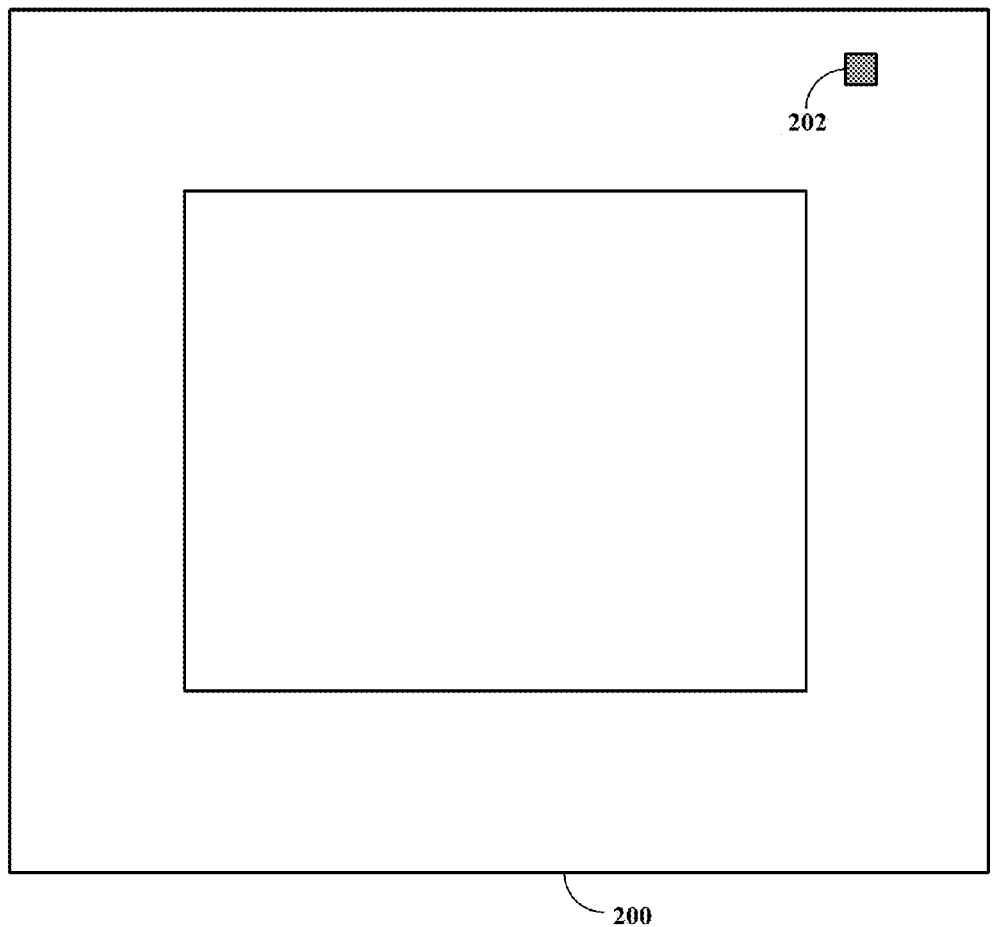
FIG. 2 is a diagram of an exemplary polygonal area to be filled with contact cuts.
Figure 3:
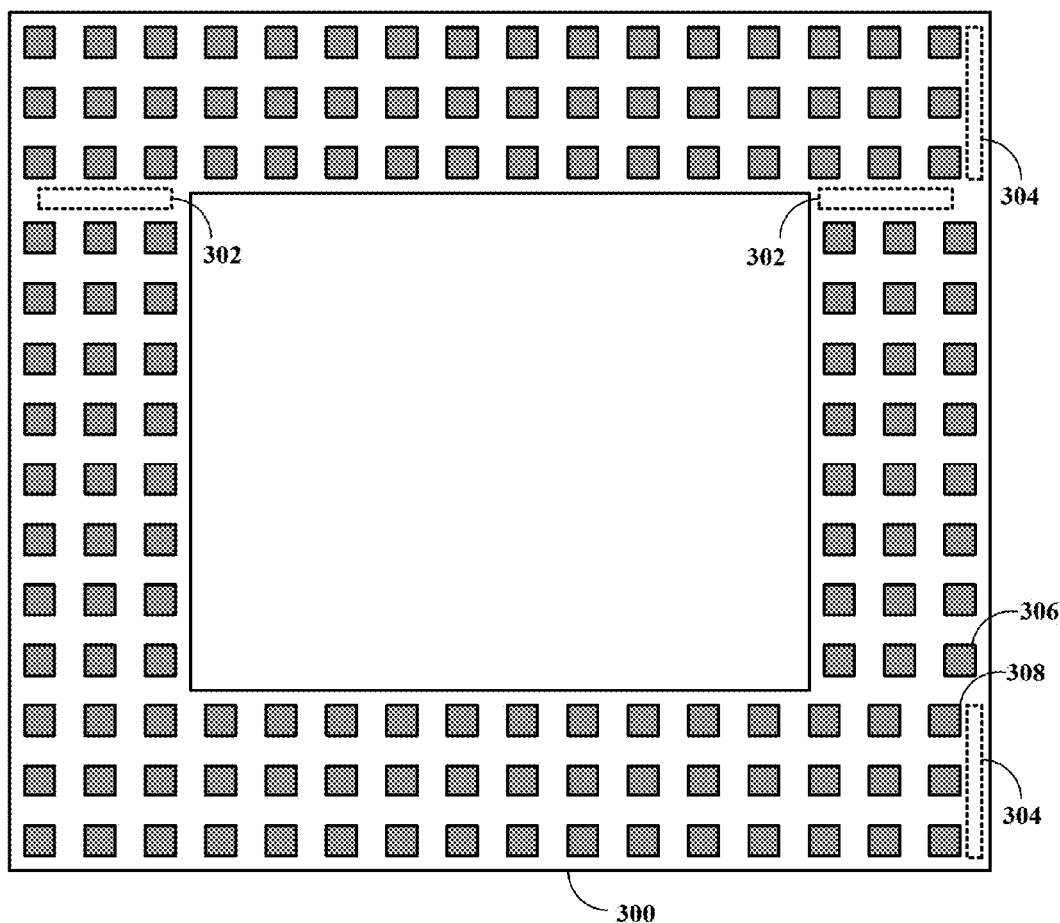
FIG. 3 is a diagram of a contact cut distribution with gaps and non-collinear contact cuts.
Figure 4:
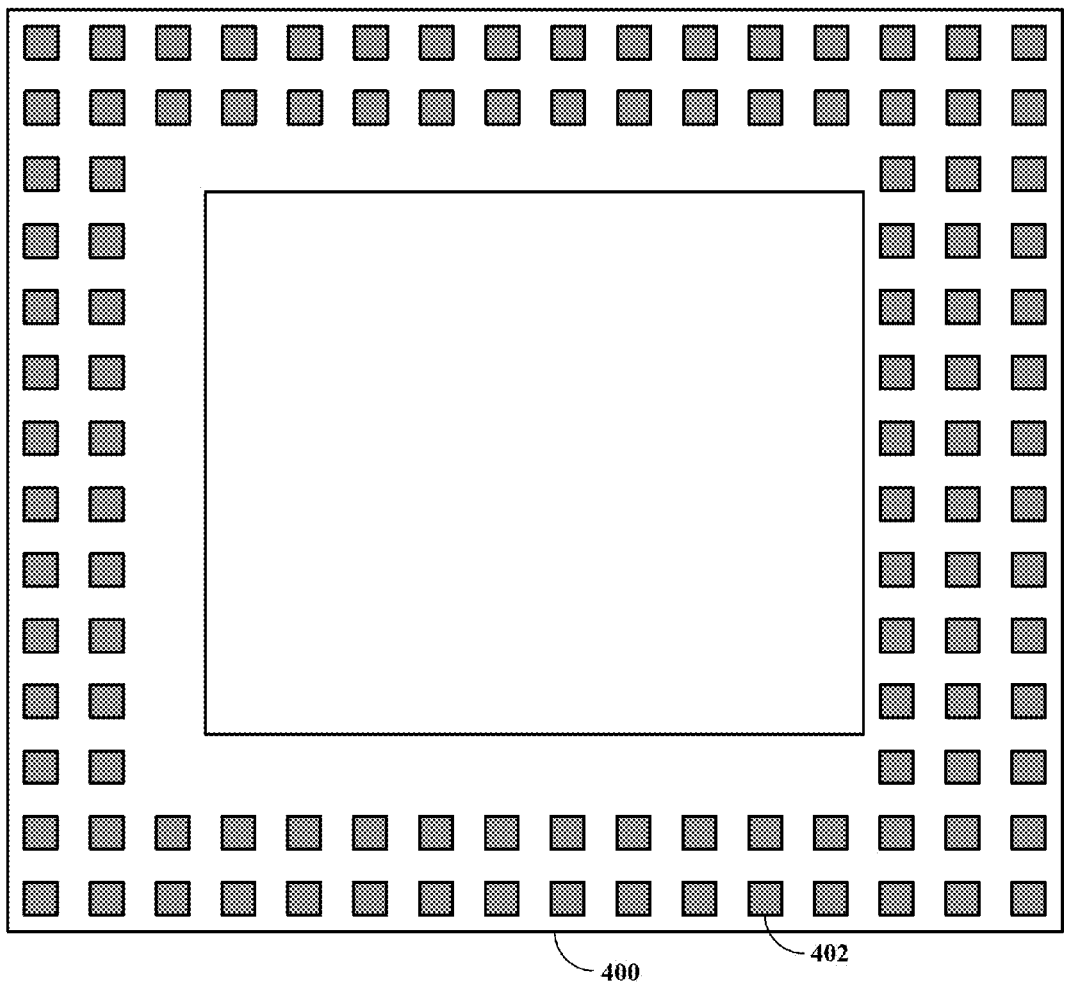
FIG. 4 is a diagram of a contact cut distribution with uniformly spaced contact cuts but with major asymmetries.
Figure 5:
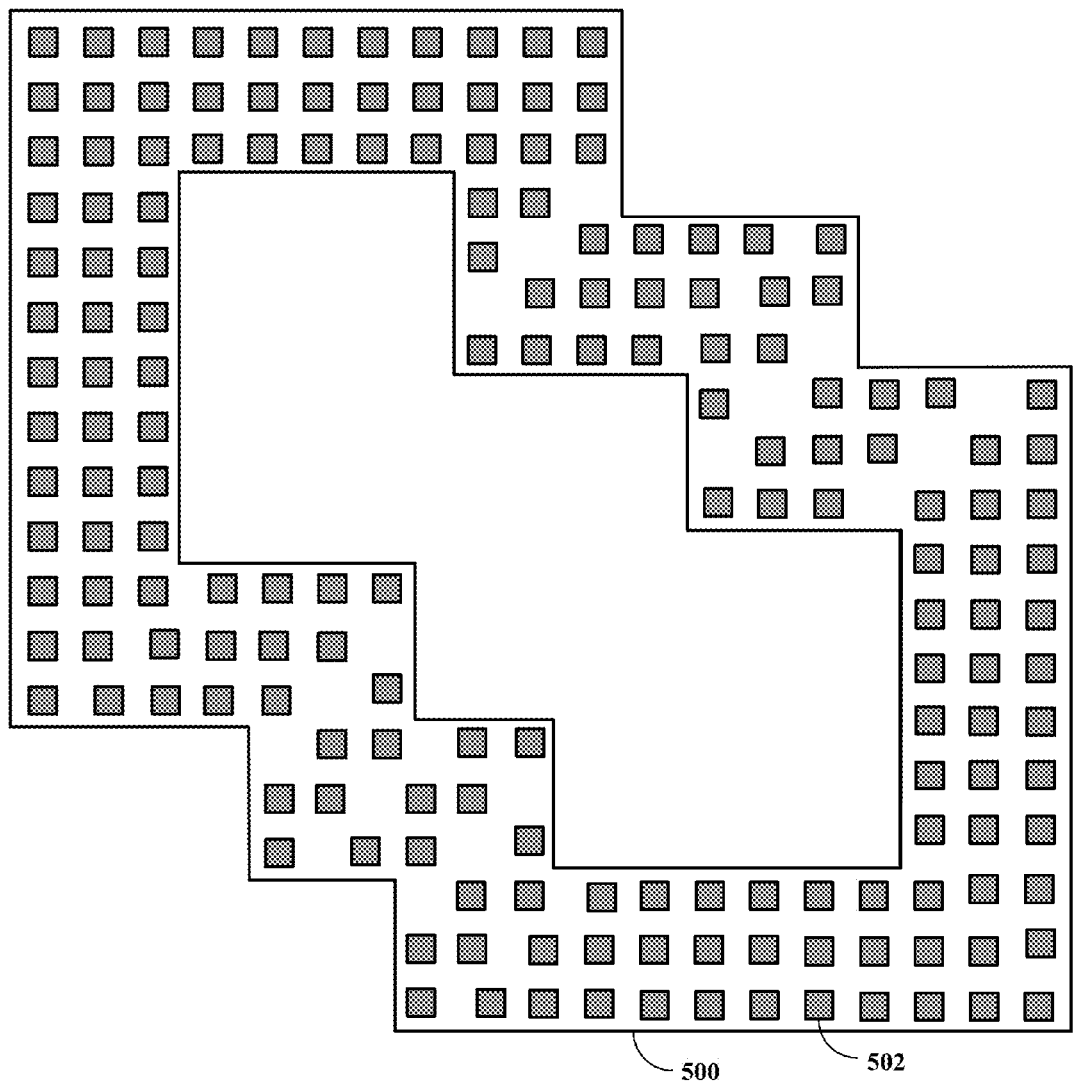
FIG. 5 is a diagram of a structure based on multiple paths/polygonal regions showing contact cut gaps in regions of corners and bends.
Figure 6A:
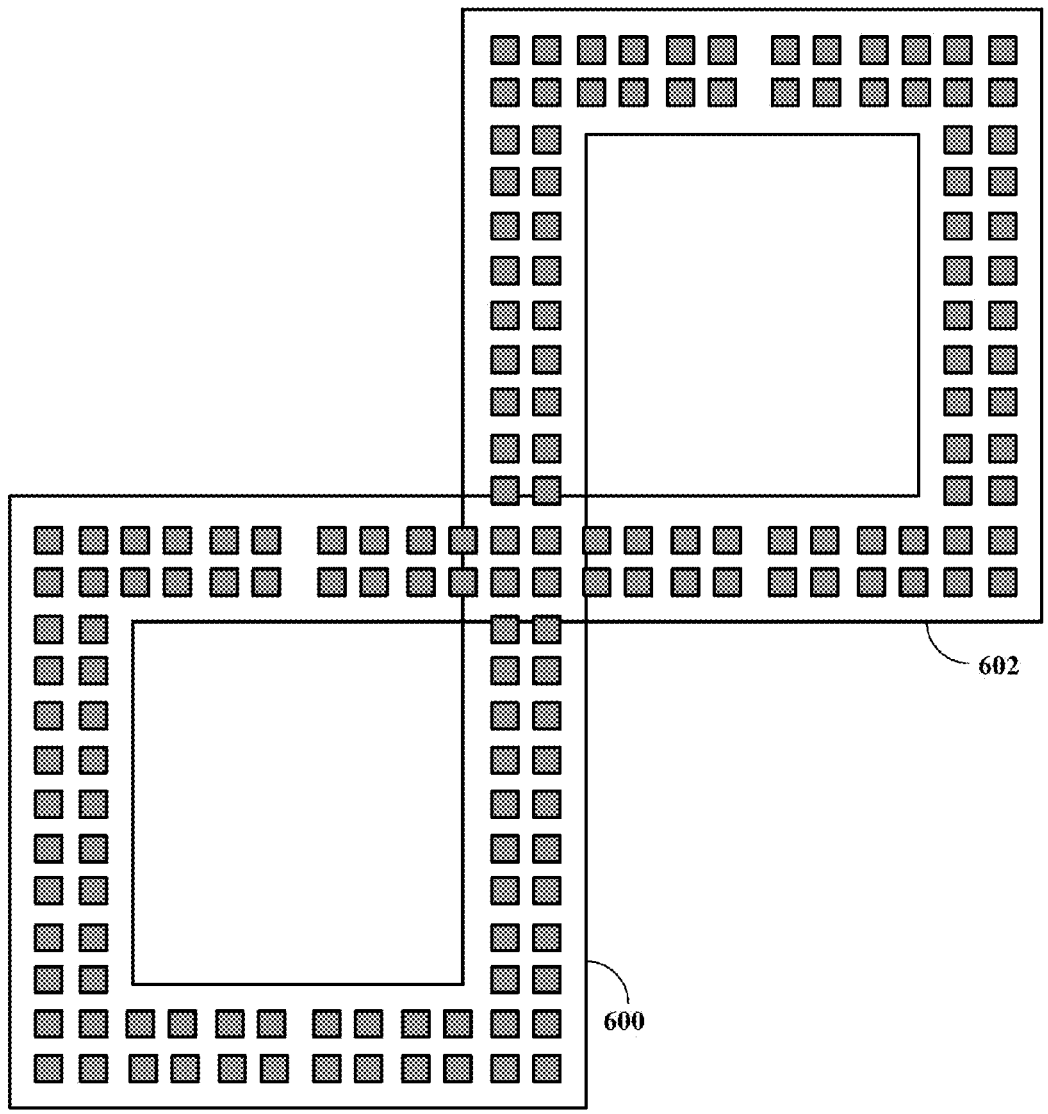
FIG. 6A is a diagram of two polygonal regions with contact cut distributions that are to be merged.
Figure 6B:
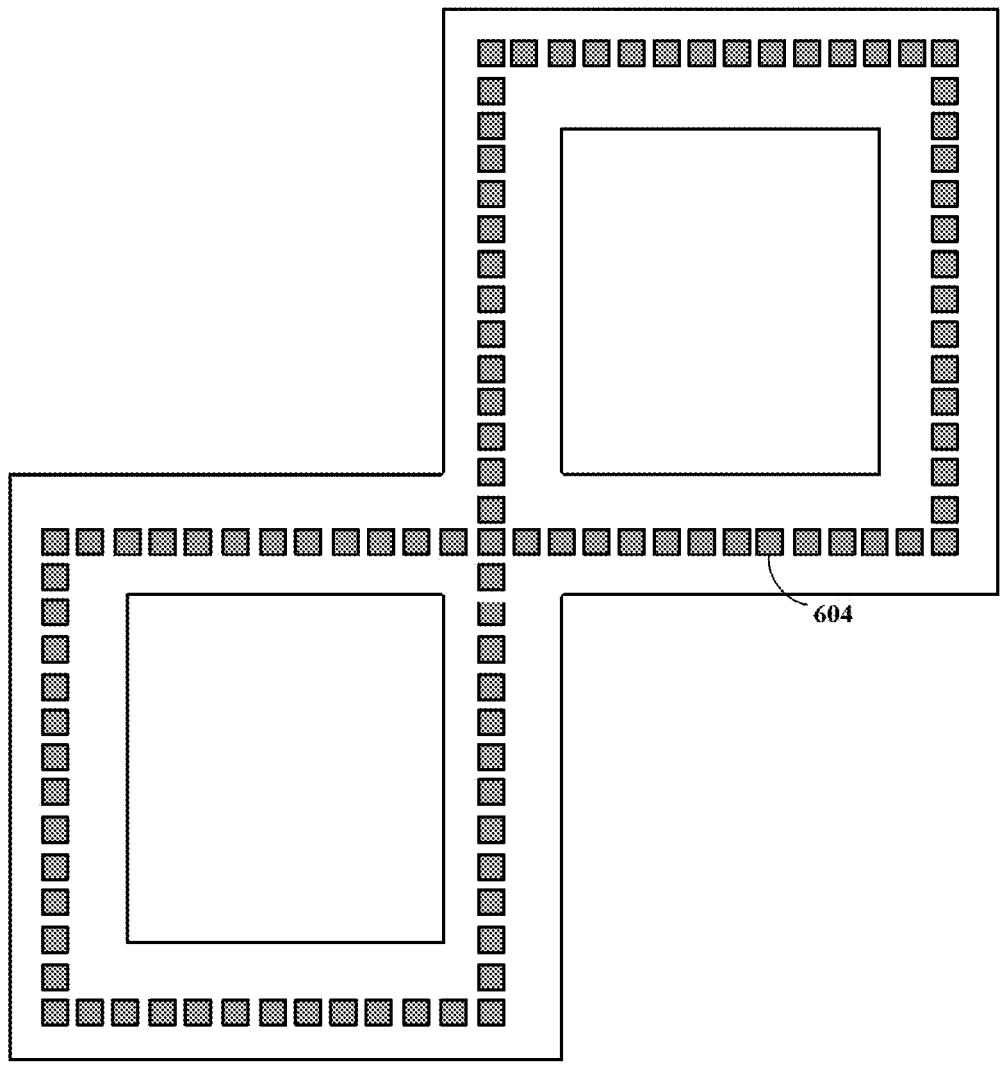
FIG. 6B is a diagram of the two polygonal regions merged by an existing tool, with resulting loss of numerous contact cuts.
Figure 7B:
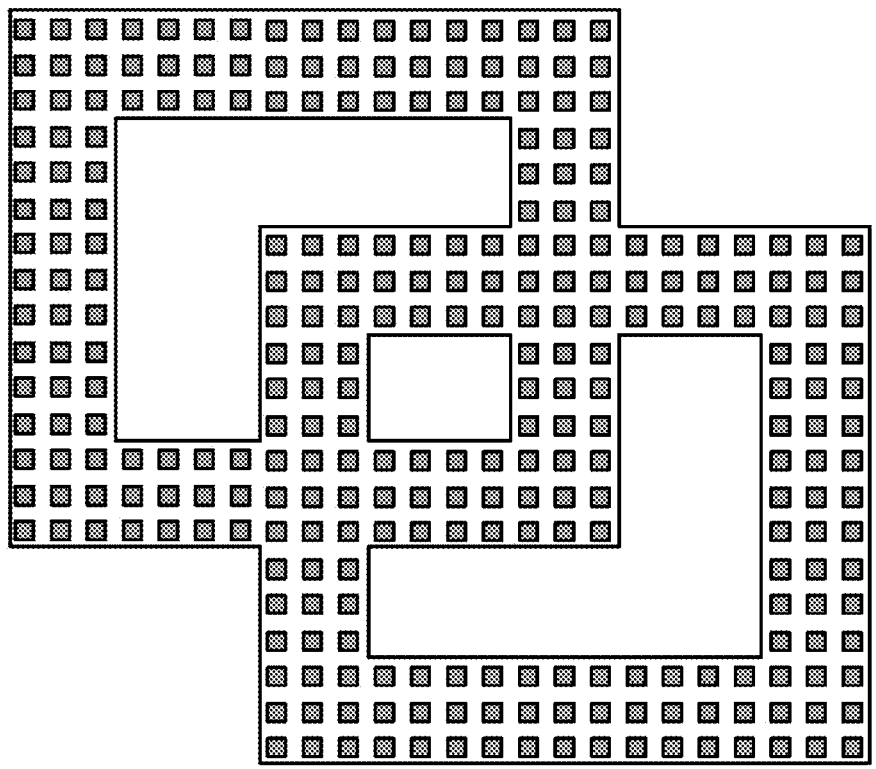
FIG. 7B is a diagram of the two further polygonal regions that have been merged according to one aspect of the present invention.
Figure 7A:
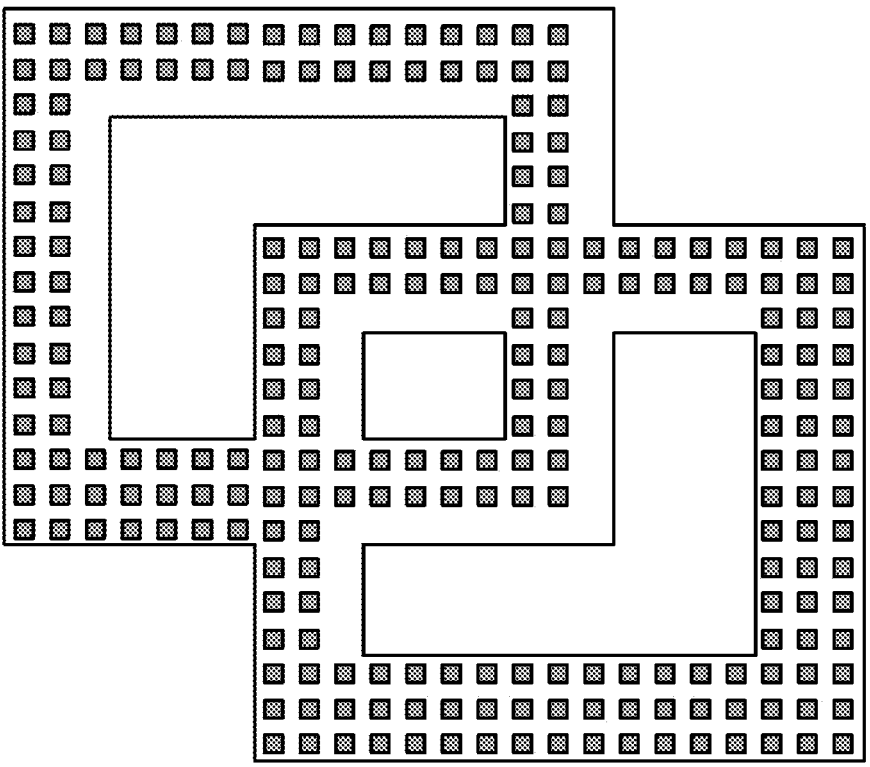
FIG. 7A is a diagram of two further polygonal regions that have merged by an existing tool.
Figure 7D:
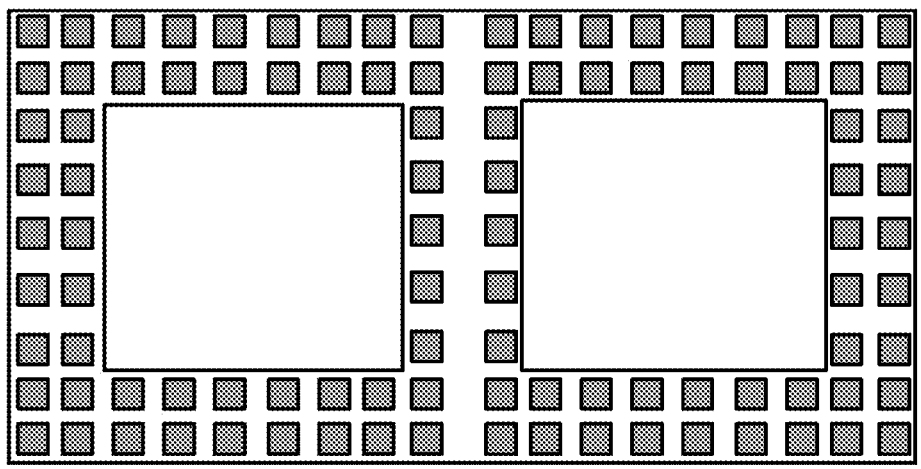
FIG. 7D is a diagram of the two additional exemplary polygonal regions that have been merged according to one aspect of the present invention.
Figure 7C:
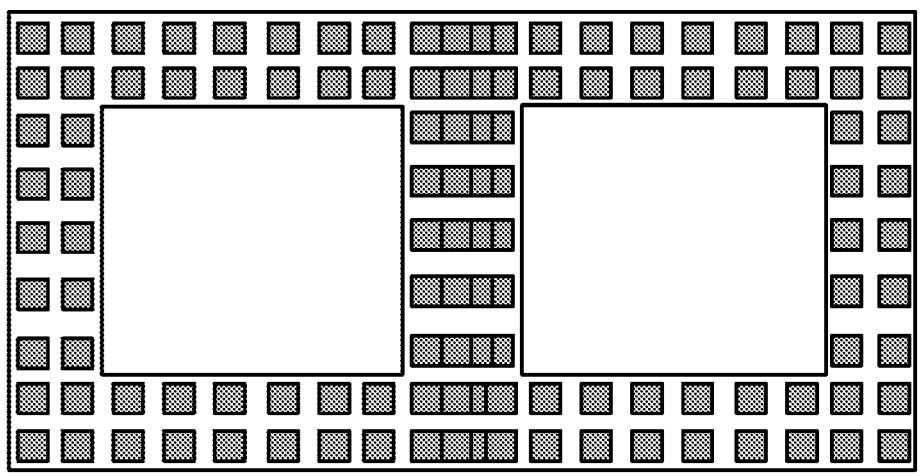
FIG. 7C is a diagram of two additional exemplary polygonal regions to be merged.

As will be described hereinafter in greater detail, one aspect of the present invention relates to automatic placement of contact cuts, metal slots, or other regular space-filling structures in integrated circuit layouts. In this application, the term "contact cut" is used to encompass all such structures. In this regard, the following description is presented to enable any person skilled in the art to make and use the invention. For purposes of explanation, specific nomenclature is set forth to provide a thorough understanding of the present invention. Description of specific applications and methods are provided only as examples. Various modifications to the preferred embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

Briefly, embodiments of the invention partition the space-filling target layout area in which contact cuts are to be distributed, typically into rectangles in separate passes, proceeding both horizontally and vertically. The embodiments then decompose intersections of the resulting horizontal shapes and vertical shapes into two types of regions: shared & exclusive. Exclusive regions are those that may be defined by a single shape from either the vertical or the horizontal partitioning passes, e.g., if an intersection region completely overlaps one of the horizontal shapes or one of the vertical shapes, then it is exclusive. In contrast, shared regions are those where horizontally-oriented and vertically-oriented shapes from the separate horizontal and vertical partitionings partially overlap. The embodiments then directionally sort the decomposed regions, for example in a top-to-bottom right-to-left order of precedence. It also should be appreciated that references to the shared or exclusive regions may be described as rectangular regions, but such references are used for purposes of illustration only and not intended to limit the possible geometry of the shared or exclusive regions.

Each decomposed region may then be separately processed by the embodiments to fill it with contact cuts using, for example, known box-filling methods. For example, the embodiments may fill each shared rectangular region using its various boundary lengths and respective enclosure values ENCL, which ensures an optimal alignment of contact cuts throughout its area. ENCL is defined as the minimum lateral enclosure dimension of the contact cut for either of the two layers to be contacted, according to the applicable design rules. The layers to be contacted may include for example metal and diffusion for guard rings, or $metal_1$ and $metal_2$ for vias.

The embodiments may then process exclusive rectangular regions somewhat differently. For an edge coinciding with any of the shared rectangles, the enclosure value used is the minimum contact cut spacing CS minus the minimum contact cut enclosure dimension ENCL; if the value of (CS-ENCL) is negative then it is set to zero for that edge. Use of such spacing ensures that contact cuts are placed as close to a boundary with a shared rectangle as allowable, considering contact cut spacing rules. For all other edges, the ENCL value is used. Note that in other embodiments the exclusive rectangular regions may be processed as the shared rectangular regions are described above, with enclosure values ENCL, and the shared rectangular regions may be processed as the exclusive rectangular regions are described above, with CS-ENCL values used. In general, embodiments may process regions having coincident edges by using an enclosure value ENCL on one side of the coincident edge, and by using an enclosure value of CS-ENCL on the opposite side of the coincident edge, to produce a more optimal result.

Next, the embodiments delete (or simply do not place) contact cuts that may cause design rule violations. For example, in some rectangles it is possible that contact cuts may end up being spaced too closely, so that a contact cut spacing rule is violated. For an orthogonally close rectangle, a minimum spacing of (CS-ENCL) may be ensured by growing (e.g., extending by a distance) a particular rectangle by (CS-ENCL) and checking for any overlap of a contact cut in a neighboring rectangle. For a diagonally close rectangle, assuming a forty-five degree relationship, a minimum diagonal spacing of (CS-SQRT(2)*ENCL) should be ensured between contact cuts. The embodiments may therefore grow a diagonally close rectangle by SQRT((CS-SQRT(2)*ENCL)^2/2) and then check for any overlap of a contact cut in a neighboring rectangle.

The embodiments may perform the process described above for placing contact cuts and deleting contact cuts with design rule violation potential for all decomposed regions. The result is a set of contact cuts of perfect alignment and of maximum possible regular/consistent distribution in different segments or parts of the space-filling area. In addition to horizontal and vertical alignment of cuts, the embodiments automatically ensure design rule constraint correctness, to meet the requirements of layout designers and foundries in a correct-by-construction manner.

Particular alternate embodiments to handle particular layout processing scenarios are also described below. The embodiments may process any type of space-filling device, or meet requirements as in metal slotting, or in auto via generation related commands to fill a layout region with contact cuts to connect two interconnect layers, or fill any rectilinear/polygonal cross-sections of wires/path segments, etc.

Figure 8A:
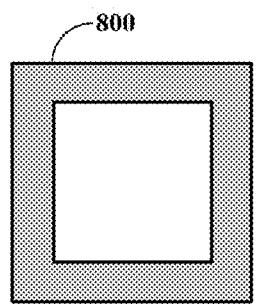
FIG. 8A is a diagram of an exemplary space-filling polygon to be filled with contact cuts according to one aspect of the present invention.

The steps of a preferred method embodiment of invention are now described separately in detail with reference to exemplary figures. Referring now to FIG. 8A, a typical space-filling polygon 800 targeted to be filled with contact cuts is depicted. Target layout areas may be specified manually, or may be computed as the intersection of areas on the layers to be interconnected. Such structures are typical for guard rings, which are intended to surround another structure with a region of approximately equal electrical potential. One objective of the present invention is to place contact cuts in such target layout areas automatically, in a manner that offers results quite close to the desired quality of manually created custom layouts in a consistent and optimal fashion.

To that end, the embodiment of the present invention:
(1) decomposes target layout areas into shared and exclusive regions,
(2) sorts the decomposed regions, and
for each decomposed region:
(3) fills each region, whether shared or exclusive, with contact cuts according to specific rules, and
(4) deletes the contact cuts that have potential to cause design rule violations.

Figure 8B:
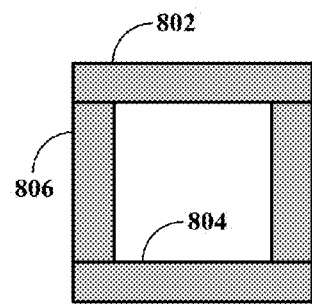
FIG. 8B depicts the polygon following horizontal partitioning according to one aspect of the present invention.

FIG. 8B depicts polygon 800 following horizontal decomposition. The embodiment scans the polygon, e.g. from top to bottom, and identifies the horizontal shapes that define the various portions of the polygon. In this case, two horizontal shapes 802 and 804 are identified along with two other horizontal shapes 806 and 808.

Figure 8C:
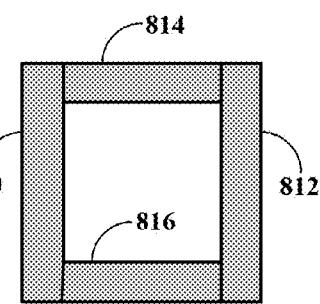
FIG. 8C depicts the polygon following vertical partitioning according to one aspect of the present invention.

FIG. 8C depicts polygon 800 following vertical decomposition. The embodiment scans the polygon in an orthogonal direction, e.g. from right to left, and identifies the vertical shapes that define the various portions of the polygon. In this case, two vertical shapes 810 and 812 are identified along with two other vertical shapes 814 and 816.

Figures 8D, 8E:
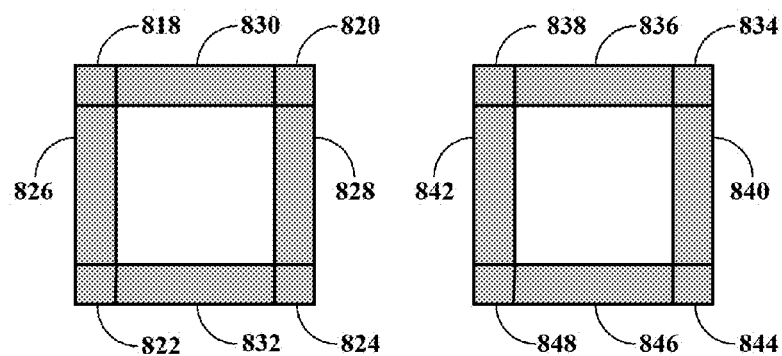
FIG. 8D depicts the polygon following identification of shared and exclusive regions according to one aspect of the present invention.
FIG. 8E depicts the polygon following sorting of the component regions according to one aspect of the present invention.

FIG. 8D depicts the polygon following identification of shared and exclusive regions. This identification is performed by the embodiment by taking intersections of the horizontal shapes 802-808 and the vertical shapes 810-816. Intersecting (overlapping) regions are shared, and non-intersecting regions are exclusive. The shared regions are the corner regions in this case, labeled as regions 818, 820, 822, and 824. The exclusive regions are the non-corner regions in this case, labeled as regions 826, 828, 830, and 832. The following pseudocode example describes getting the desired decomposed shapes:

```
hShapes=get horizontally decomposed shapes.
vShapes=get vertically decomposed shapes
For each hShape in hShapes {
  For each vShape in vShapes {
    and Shapes=AND(hShape vShape)
    decomposedShapes=append(decomposedShapes and Shapes)
  }
}
```

The following pseudocode example describes isolating the shared and exclusive regions from the decomposed shapes:

```
For each dShape in decomposedShapes {
  If the dShape completely overlaps with one of the hShapes or vShapes {
    It is an exclusive region.
  }
  else {
    It is a shared region.
  }
}
```

Next, the embodiment may sort the decomposed regions (shared and exclusive) directionally, for example in a top-tobottom right-to-left order of precedence. This step helps in symmetrical distribution and efficient identification of potential violations of contact spacing when contact cuts with design rule violations are deleted later on. FIG. 8E depicts the polygon following sorting of the component regions, now labeled in a particular order as items 834-848. These regions will preferably be processed by the embodiment in the sorted order.

Figure 9:
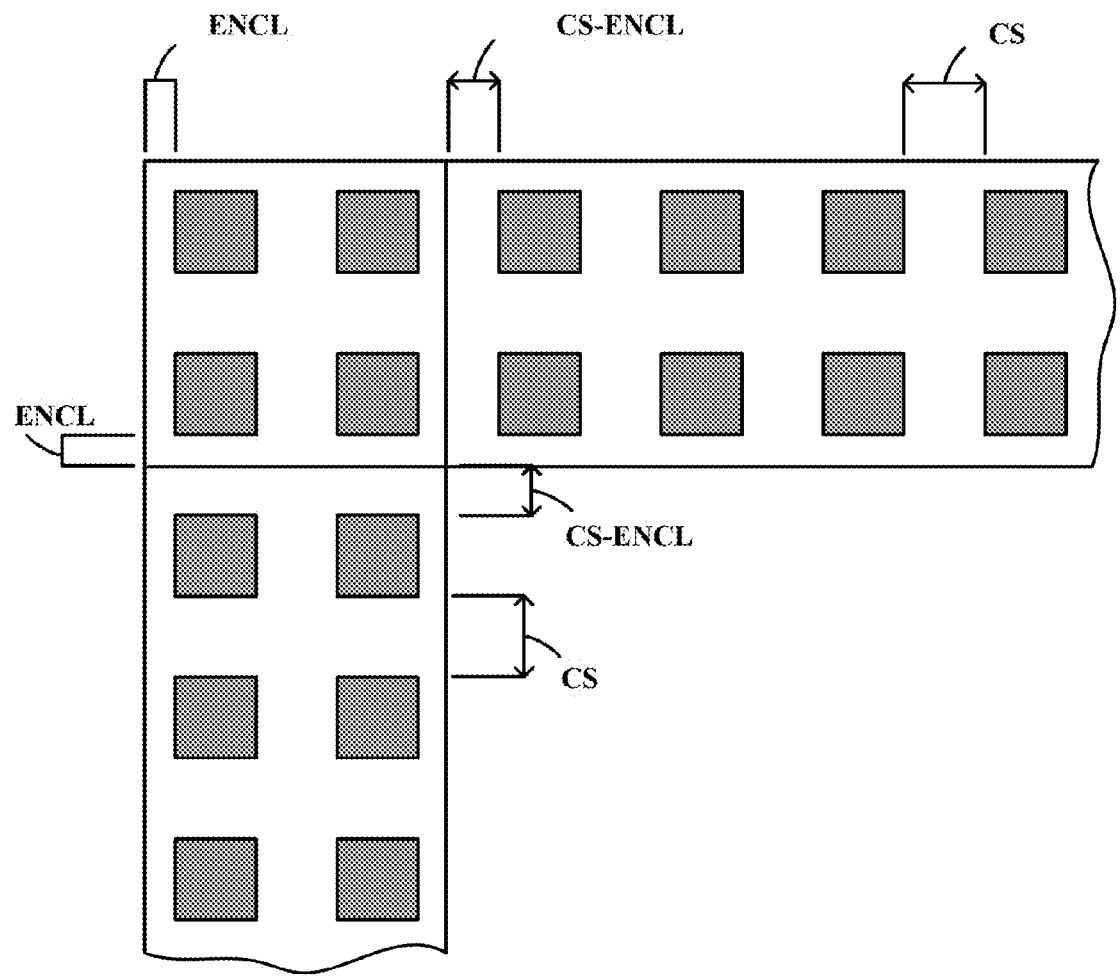
FIG. 9 is a diagram of a contact cut distribution depicting idealized design rule based geometries according to one aspect of the present invention.

FIG. 9 depicts a contact cut distribution with idealized design rule based geometries. In this case, each contact cut is separated laterally from the polygon boundary by a distance of ENCL, so the area immediately surrounding each contact cut is kept as small as possible. Contact cuts are separated from each other, both vertically and horizontally, by a distance of CS, so the contact cuts are as close together as possible.

To ensure this condition, when an exclusive region for example has a contact cut near an edge that is coincident with a shared region for example, the embodiment may space contact cuts in the exclusive region a distance of (CS-ENCL) from the coincident edge. If the value of (CS-ENCL) is less than zero, which is possible given particular design rules, then an enclosure value of zero is used for such a coincident edge. For all other edges, the enclosure value used is ENCL. Alternatively, the shared region contact cuts may instead be placed in the same manner a distance of (CS-ENCL) from the coincident edge if appropriate, and then the exclusive region contact cuts may be placed with an enclosure value of ENCL. These rules for filling the shared and exclusive regions with contact cuts drive design rule correct geometries that maintain legitimate contact spacing and help with maintaining contact cut alignment as well.

Figure 10A:
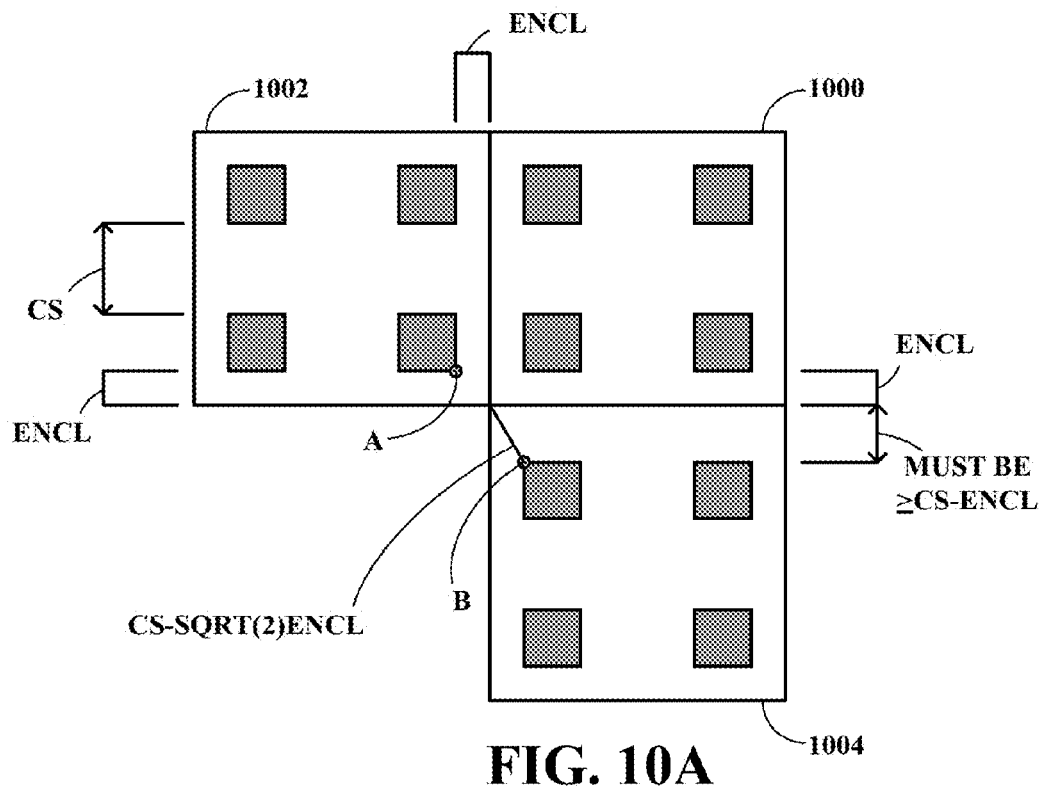
FIG. 10A is a diagram of a contact cut distribution depicting design rule based geometries requiring contact cut deletion due to possible design rule violations according to one aspect of the present invention.

FIG. 10A depicts a contact cut distribution depicting design rule based geometries requiring contact cut deletion due to design rule violations. The previous steps described place contact cuts as densely as possible with collinear contact cut arrangements, but may place contact cuts too closely together in some circumstances. Consider three shared rectangles 1000, 1002, and 1004. The enclosure value chosen for each rectangle may be ENCL, as all three are shared regions. When rectangle 1004 is filled, some contact cuts near the edge coincident with rectangle 1000 may violate a contact spacing rule, and must be deleted.

For an orthogonally close shared rectangle, like 1000, a minimum spacing of (CS-ENCL) from the contact cut may need to be ensured. One way of checking this minimum spacing is to grow rectangle 1000 by (CS-ENCL) and check for an overlap with a rectangle 1004 contact cut.

For a diagonally close shared rectangle, like 1002, a minimum spacing of CS-SQRT(2)*ENCL may need to be ensured. Note this value assumes a forty-five degree diagonal; other diagonals will be discussed further below. One way of checking the minimum spacing is to grow rectangle 1002 by (SQRT(((CS-SQRT(2)ENCL)^2)/2)) and check for an overlap with a rectangle 1004 contact cut. It should be noted that this check would be useful only when shared rectangle 1000 is not present, e.g., the only two rectangles under consideration are 1002 and 1004; otherwise, the diagonal check may prove to be redundant, as the (CS-ENCL) check for rectangle 1000 would be sufficient to remove the contact cuts with potential violations. In other words, the diagonal spacing between two nearby contact cuts in a regular array will be larger than their orthogonal spacing.

Figure 10B:
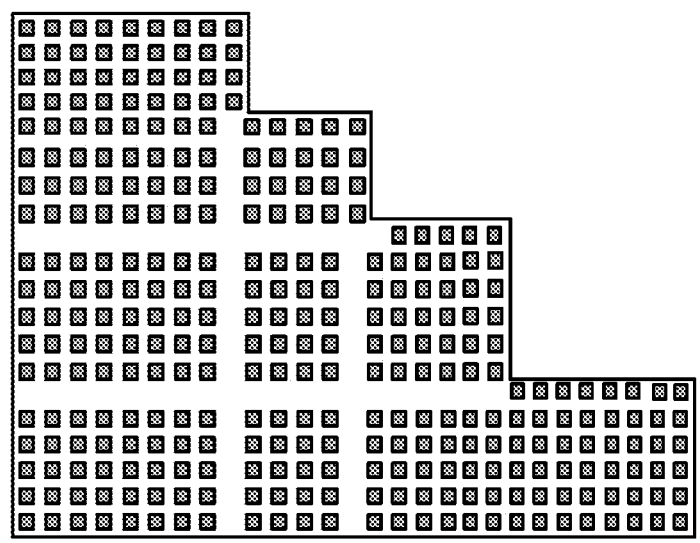
FIG. 10B is a diagram of a contact cut distribution produced according to a modified version of this aspect of the present invention.

For a case where contact cuts may not be placed at a forty-five degree angle with respect to each other, this check may be a pessimistic approximation to avoid a design rule violation. Such a case could arise where contact cuts are distributed using a "minimum" gap mode, which uses an exact CS design rule value for contact cut spacing, and leaves any slack at the side of the bounding box or rectangle being filled. The embodiment may therefore be modified to allow additional slack in growing rectangle 1002, and may check to ensure that appropriate distance exists between the closest corners between diagonally neighboring contact cuts in different rectangles (labeled here as exemplary points A and B). This distance should be less than or equal to CS before deciding to delete a contact cut. FIG. 10B depicts a contact cut distribution produced according to this aspect of the invention.

In some cases, in order to increase precedence of the maximum number of contact cuts, another embodiment may instead perform preprocessing to merge all the adjoining shared regions after sorting them, but before filling them. In this way, the total number of contact cuts in the target layout area increases, at the cost of losing alignment in a few areas. This embodiment may manage the tradeoff between maximizing the number of contact cuts and ensuring perfect contact cut alignment according to specified user requirements, as these options could be in conflict.

Figure 11A:
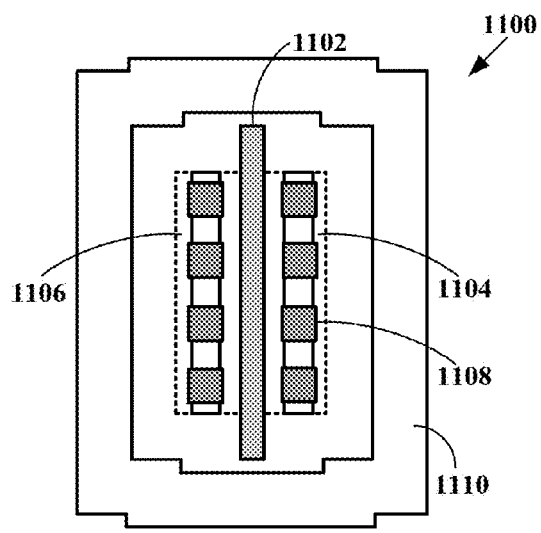
FIG. 11A is a diagram of a MOS transistor with source and drain contact cuts and a fluid guard ring that has yet to be filled with contact cuts.

FIG. 11A depicts a MOS transistor structure 1100. The structure includes a polysilicon gate 1102, source and drain diffusions 1104 and 1106, several source and drain contact cuts 1108, and a fluid guard ring 1110 that is to be filled with contact cuts. This structure is extremely common in integrated circuit layouts.

Figure 11B:
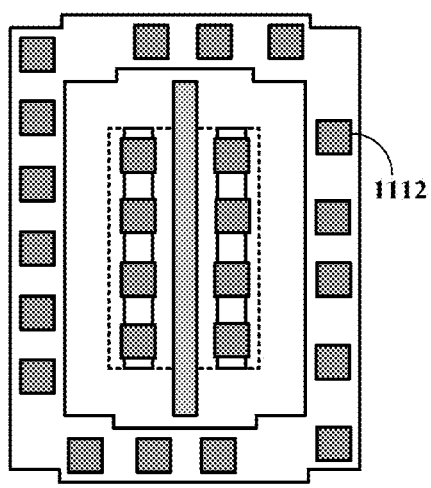
FIG. 11B is a diagram of the transistor with asymmetric and unevenly spaced guard ring contact cuts.

FIG. 11B depicts the transistor structure with several asymmetric and unevenly spaced guard ring contact cuts 1112 as produced by known contact cut placement systems. Small bends, small jogs, or other small areas chopped from a structure, which may not always be consistent with design rules, often result in contact cut distribution problems.

Figure 11C:
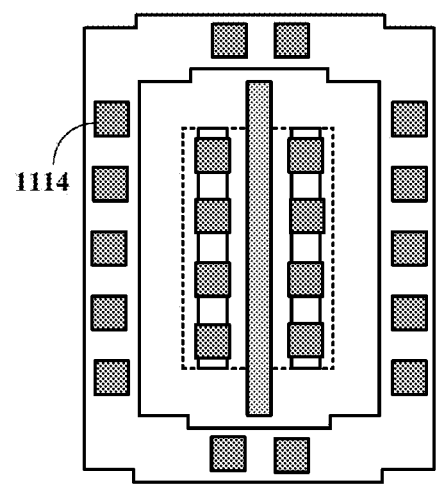
FIG. 11C is a diagram of the transistor with symmetric and evenly spaced guard ring contact cuts according to one aspect of the present invention.

FIG. 11C depicts the transistor structure with symmetric and evenly spaced guard ring contact cuts 1114 as produced by yet another embodiment of the present invention. Problems as shown in FIG. 11B may be resolved by preprocessing the decomposed shapes before filling them with contact cuts. The small-width partitioned shapes that cannot hold even a single contact cut (for example, with horizontal or vertical dimensions of less than (CW+2*ENCL), where CW is the contact cut width) may be merged with the adjoining shapes of, for example, like horizontal or vertical orientation prior to the identifying of shared regions and exclusive regions.

Figure 12:
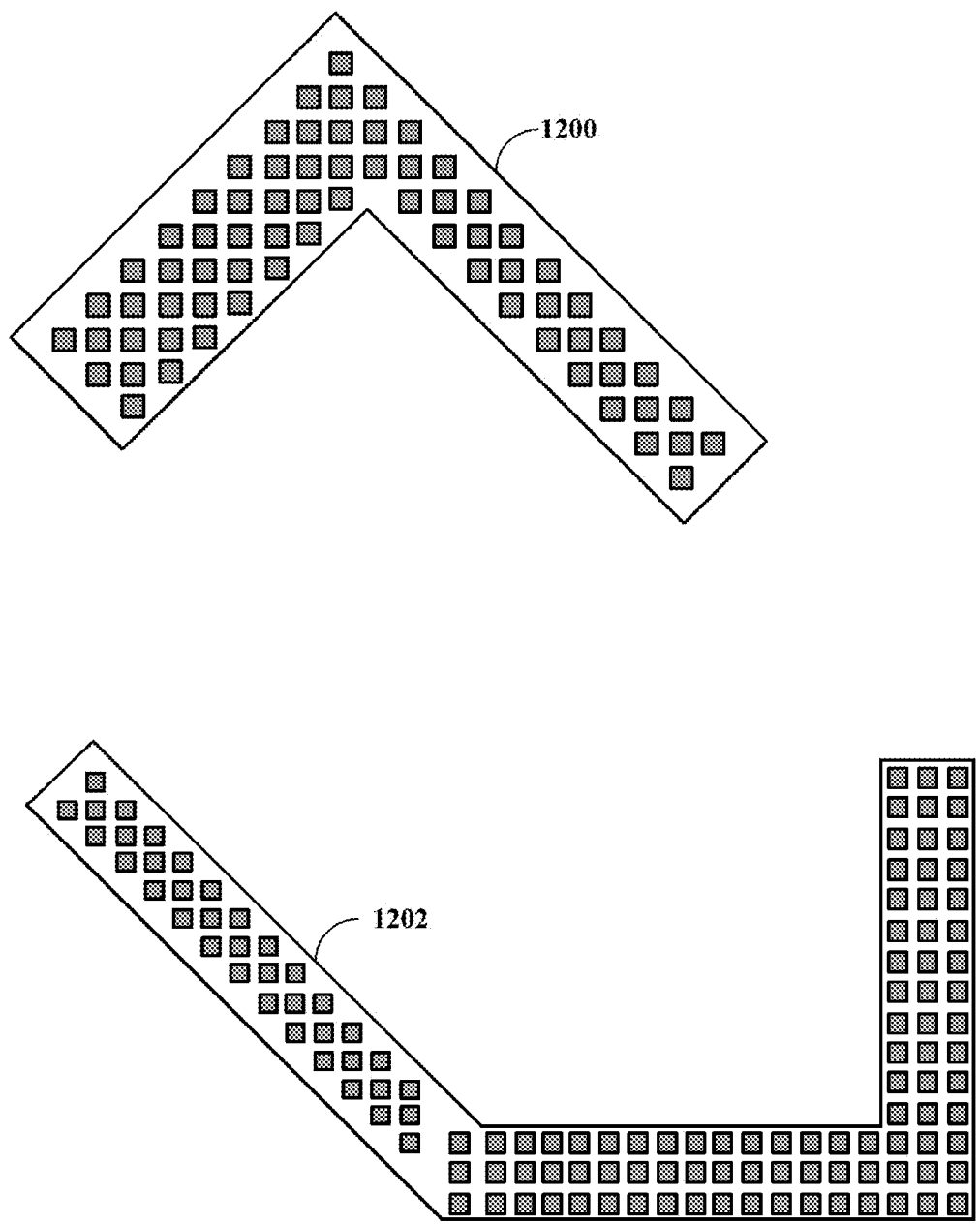
FIG. 12 is a diagram of polygons with 45-degree diagonal boundaries filled with contact cuts according to an aspect of the present invention.

FIG. 12 depicts polygons 1200 and 1202 with forty-five degree diagonal boundaries filled with contact cuts. Non-orthogonal or rotated segments or edges may be supported with an additional embodiment of the present invention. The exemplary embodiment previously described in connection with FIG. 10A may be updated with additional steps, including: after the sorting step, (1) identify non-orthogonal or rotated edges/segments in the target layout area's partitioned shapes, (2) take unions of all such non-orthogonal or rotated shapes, and (3) employ a bounding box fill approach to fill all such non-orthogonal or rotated shapes with contact cuts. The bounding box fill approach, which is generally known in the art, may comprise (a) finding a bounding box of the non-orthogonal or rotated polygon shape, (b) filling the bounding box with contact cuts, and (c) deleting the contact cuts that do not lie inside the input non-orthogonal or rotated polygon.

Another embodiment may maximize the number of contact cuts, but at the cost of losing a few perfect alignments. This heuristic embodiment is similar to the embodiment described earlier in connection with FIG. 10A, but (1) merges all the adjoining shared regions before filling them, (2) merges the narrow shared regions, and (3) fills shared regions using the same rule described previously as being used for exclusive regions. In this case, narrow shared regions may be those with at least one of a length and width less than (CW+2*ENCL) for example, or alternately at least one of a length and width less than (CS+2*CW+2*ENCL). In this embodiment, shared regions are filled using (CS-ENCL) as the enclosure value for those edges that are adjoining another shared region, while for the other edges the enclosure value used is ENCL.

Figure 13:
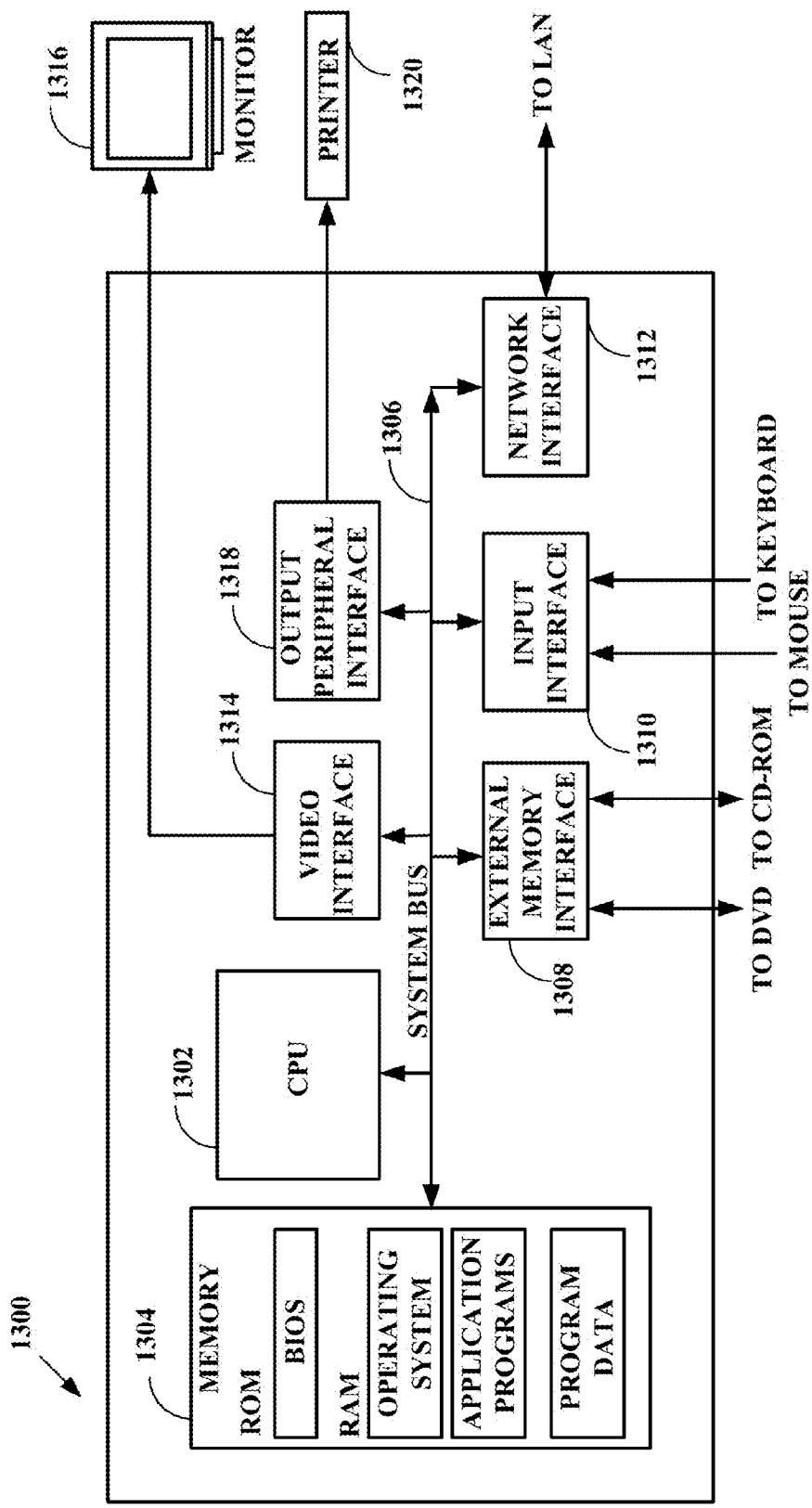
FIG. 13 is a diagram of a computer system according to an aspect of the present invention.

FIG. 13 depicts a computer system comprising the structure for implementation of the embodiments described above. Computer system 1300 comprises a central processing unit (CPU) 1302 that processes data stored in memory 1304 exchanged via system bus 1306. Memory 1304 typically includes read-only memory, such as a built-in operating system, and random-access memory, which may include an operating system, application programs, and program data. Computer system 1300 also comprises an external memory interface 1308 to exchange data with a DVD or CD-ROM for example. Further, input interface 1310 may serve to receive input from user input devices including but not limited to a keyboard and a mouse. Network interface 1312 may allow external data exchange with a local area network (LAN) or other network, including the internet. Computer system 1300 also typically comprises a video interface 1314 for displaying information to a user via a monitor 1316. An output peripheral interface 1318 may output computational results and other information to output devices including but not limited to a printer 1320.

Computer system 1300 may comprise for example a personal computer or an engineering workstation, each of which is widely known in the art and is commonly used for integrated circuit layout design tasks, along with software products commercially available for performing computer-aided integrated circuit layout design tasks including contact cut placement. The computer system of FIG. 13 may for example receive program instructions, whether from existing software products or from embodiments of the present invention, via a computer program product and/or a network link to an external site.

Figure 14:
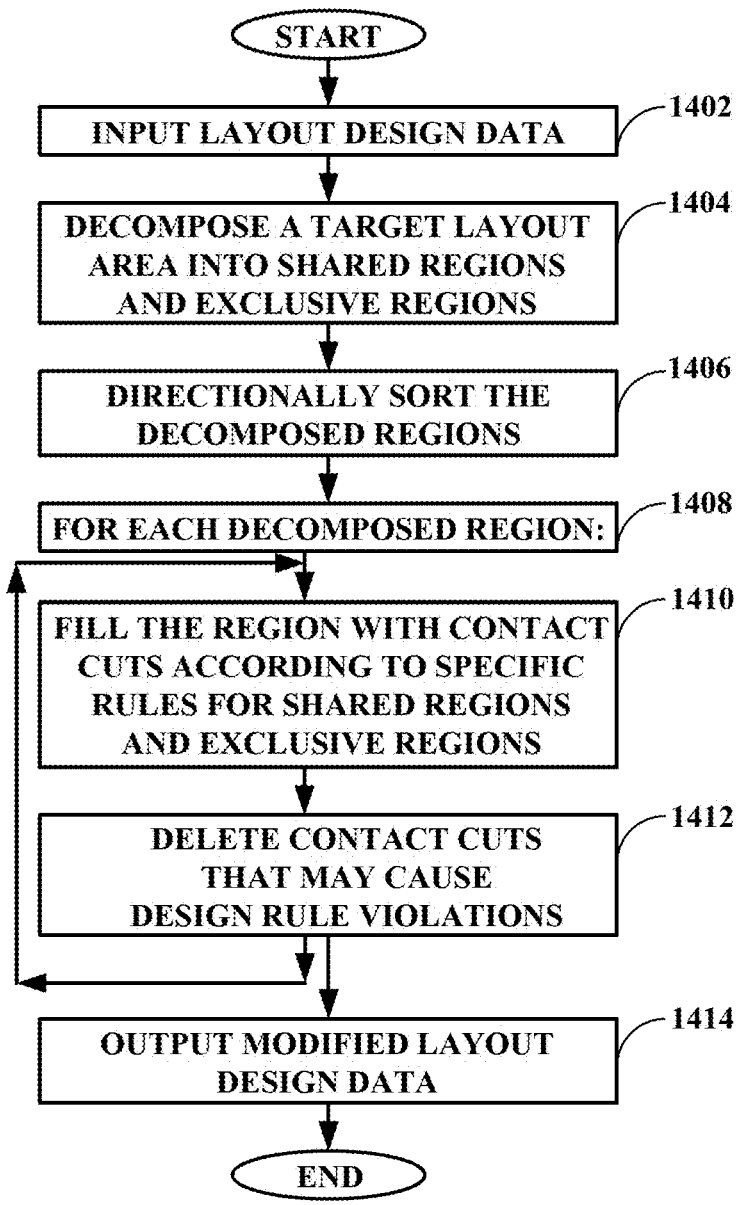
FIG. 14 is a flowchart of instructions executed by a computer system according to an embodiment of the present invention.

Referring now to FIG. 14, a flowchart of the programmed operation of computer system 1300 is depicted. First, in step 1402, the computer system receives layout design data. In step 1404, the computer system decomposes a target layout area into shared regions and exclusive regions by following specific instructions as described above regarding one or more embodiments. In step 1406, the computer system directionally sorts the decomposed regions as previously described. In step 1408, the computer system initiates a loop over the decomposed regions, and performs the following steps for each decomposed region: in step 1410, the computer system fills the region with contact cuts according to specific rules for shared regions and exclusive regions, and in step 1412 the computer system deletes contact cuts in regions that may cause design rule violations. Specific instructions for steps 1410 and 1412 were previously described. Once the loop is finished, in step 1414 the computer system outputs the modified layout design data, for use in integrated circuit fabrication for example, as is known in the art.

The computer system may selectively perform contact cut placement using existing software products and/or by executing instructions corresponding to specific steps of embodiments of the present invention described above. The selection of instructions to be executed for contact cut placement may for example be made manually during a design layout editing session, or may be made automatically according to parameters set within the executable instructions. The computer system may for example execute instructions in a C, C++, or SKILL program file to modify input layout design data by placing contact cuts within the set of input shapes as described by one or more of the embodiments, and then to output the modified layout design data.

The embodiments described help automate consistent alignment and symmetric placement of contact cuts in a given rectilinear or polygonal region or sub-parts of the space-filling region for any layout design requirement. The application of the embodiments to guard rings has been validated to generate an optimum distribution/placement of contact cuts that is in line with the manual drawing of contact cuts done by layout designers in similar scenarios. So, the embodiments automatically capture and meet the designers' intent.

The embodiments also help to generate proper contact cut alignment across parallel arms of guard rings, providing additional advantages to layout designers to share guard rings on edges of instances being tiled in the upper level design. From a layout designer's perspective, this feature has the potential to save chip area as well as to reduce the need to worry about instance mirror/orientation during stacking or tiling in different blocks.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described below with reference to operations that are performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiments are essentially the code segments to perform the necessary tasks. The non-transitory code segments may be stored in a processor readable medium or computer readable medium, which may include any medium that may store or transfer information. Examples of such media include an electronic circuit, a semiconductor memory device, a read-only memory (ROM), a flash memory or other non-volatile memory, a floppy diskette, a CD-ROM, an optical disk, a hard disk, a fiber optic medium, etc. User input may include any combination of a keyboard, mouse, touch screen, voice command input, etc. User input may similarly be used to direct a browser application executing on a user's computing device to one or more network resources, such as web pages, from which computing resources may be accessed.

While particular embodiments of the present invention have been described, it is to be understood that various different modifications within the scope and spirit of the invention are possible. The invention is limited only by the scope of the appended claims.

What is claimed is:

1. A computer-implemented method for placing contact cuts, comprising:
    decomposing a target layout area into shared regions and exclusive regions;
    directionally sorting the decomposed regions;
    for each decomposed region,
        filling the decomposed region with contact cuts according to specific rules for shared regions and exclusive regions; and
        deleting contact cuts that may cause design rule violations.

2. The method of claim 1 wherein the target layout area is at least one of a polygon, a path, a path segment, and a wire.

3. The method of claim 1 wherein the target layout area is at least one of a metal slot and an intersection between two layers to be electrically interconnected.

4. The method of claim 1 wherein decomposing the target layout area comprises:
    scanning the target layout area horizontally and vertically to identify partitioned shapes; and
    identifying shared regions and exclusive regions as intersecting and non-intersecting partitioned shapes, respectively.

5. The method of claim 1 wherein the sorting is top-to-bottom right-to-left.

6. The method of claim 1 wherein the contact cuts are placed at a minimum enclosure dimension distance ENCL from decomposed region boundaries.

7. The method of claim 6 wherein, for decomposed regions having a coincident edge with a neighboring orthogonally close decomposed region, the contact cuts are placed at a distance from the coincident edge equal to the minimum contact cut spacing CS minus the minimum enclosure distance ENCL, with the quantity (CS-ENCL) limited to zero if negative.

8. The method of claim 1 wherein the contact cuts that may cause design rule violations are detected by:
    growing the decomposed region in which they are placed; and
    detecting any overlap of another contact cut in a neighboring decomposed region.

9. The method of claim 1 further comprising merging adjoining shared regions prior to the filling.

10. The method of claim 4 further comprising merging narrow partitioned shapes with adjoining partitioned shapes prior to the identifying of the shared and exclusive regions.

11. The method of claim 1 further comprising:
    identifying rotated portions in the target layout area;
    taking unions of all the rotated portions; and
    performing the filling for each rotated portion by:
        finding a bounding box of the rotated portion shape;
        filling the bounding box with contact cuts; and
        deleting the contact cuts that are not inside the rotated portion.

12. A non-transitory computer readable medium storing instructions that, when executed by a processor, perform a method for placing contact cuts, the method comprising:
    decomposing a target layout area into shared regions and exclusive regions;
    directionally sorting the decomposed regions;
    for each decomposed region,
        filling the decomposed region with contact cuts according to specific rules for shared regions and exclusive regions; and
        deleting contact cuts that may cause design rule violations.

13. The computer readable medium of claim 12 wherein the target layout area is at least one of a polygon, a path, a path segment, and a wire.

14. The computer readable medium of claim 12 wherein the target layout area is at least one of a metal slot and an intersection between two layers to be electrically interconnected.

15. The computer readable medium of claim 12 wherein decomposing the target layout area comprises:
    scanning the target layout area horizontally and vertically to identify partitioned shapes; and
    identifying shared regions and exclusive regions as intersecting and non-intersecting partitioned shapes, respectively.

16. The computer readable medium of claim 12 wherein the sorting is top-to-bottom right-to-left.

17. The computer readable medium of claim 12 wherein the contact cuts are placed at a minimum enclosure dimension distance ENCL from decomposed region boundaries.

18. The computer readable medium of claim 17 wherein, for decomposed regions having a coincident edge with a neighboring orthogonally close decomposed region, the contact cuts are placed at a distance from the coincident edge equal to the minimum contact cut spacing CS minus the minimum enclosure distance ENCL, with the quantity (CS-ENCL) limited to zero if negative.

19. The computer readable medium of claim 12 wherein the contact cuts that may cause design rule violations are detected by:
    growing the decomposed region in which they are placed; and
    detecting any overlap of another contact cut in a neighboring decomposed region.

20. The computer readable medium of claim 12 wherein the method further comprises merging adjoining shared regions prior to the filling.

21. The computer readable medium of claim 15 wherein the method further comprises merging narrow partitioned shapes with adjoining partitioned shapes prior to the identifying of the shared and exclusive regions.

22. The computer readable medium of claim 12 wherein the method further comprises:
    identifying rotated portions in the target layout area;
    taking unions of all the rotated portions; and
    performing the filling for each rotated portion by:
        finding a bounding box of the rotated portion shape;
        filling the bounding box with contact cuts; and
        deleting the contact cuts that are not inside the rotated portion.

23. A system for placing contact cuts, comprising:
    a processor executing instructions to:
    decompose a target layout area into shared regions and exclusive regions;
    directionally sort the decomposed regions;
    for each decomposed region,
        fill the decomposed region with contact cuts according to specific rules for shared regions and exclusive regions; and
        delete contact cuts that may cause design rule violations.

24. The system of claim 23 wherein the contact cuts are placed at a minimum enclosure dimension distance ENCL from decomposed region boundaries.

25. The system of claim 23 wherein, for decomposed regions having a coincident edge with a neighboring orthogonally close decomposed region, the contact cuts are placed at a distance from the coincident edge equal to the minimum contact cut spacing CS minus the minimum enclosure distance ENCL, with the quantity (CS-ENCL) limited to zero if negative.

* * * * *

UNITED STATES PATENT AND TRADEMARK OFFICE
CERTIFICATE OF CORRECTION

| | | |
|---|---|---|
| PATENT NO. | : 8,490,038 B1 | Page 1 of 1 |
| APPLICATION NO. | : 13/595942 | |
| DATED | : July 16, 2013 | |
| INVENTOR(S) | : Rajan Arora et al. | |

It is certified that error appears in the above-identified patent and that said Letters Patent is hereby corrected as shown below:

On the Title Page:

Item (73), please correct the Assignee's name to read:

(73) Cadence Design Systems, Inc., San Jose, CA (US)

Signed and Sealed this
Seventeenth Day of September, 2013

Teresa Stanek Rea
*Deputy Director of the United States Patent and Trademark Office*